United States Patent
Strei et al.

(10) Patent No.: US 9,674,976 B2
(45) Date of Patent: Jun. 6, 2017

(54) WIRELESS PROCESS COMMUNICATION ADAPTER WITH IMPROVED ENCAPSULATION

(75) Inventors: David Matthew Strei, Waconia, MN (US); Joel David Vanderaa, St. Paul, MN (US)

(73) Assignee: Rosemount Inc., Eden Prairie, MN (US)

( * ) Notice: Subject to any disclaimer, the term of this patent is extended or adjusted under 35 U.S.C. 154(b) by 452 days.

(21) Appl. No.: 12/870,448

(22) Filed: Aug. 27, 2010

(65) Prior Publication Data
US 2011/0053526 A1     Mar. 3, 2011

Related U.S. Application Data

(63) Continuation-in-part of application No. 12/485,169, filed on Jun. 16, 2009.

(60) Provisional application No. 61/239,116, filed on Sep. 2, 2009.

(51) Int. Cl.
*H04B 1/08*   (2006.01)
*H05K 5/06*   (2006.01)
*H05K 7/14*   (2006.01)

(52) U.S. Cl.
CPC .......... *H05K 5/064* (2013.01); *H05K 7/1462* (2013.01)

(58) Field of Classification Search
None
See application file for complete search history.

(56) References Cited

U.S. PATENT DOCUMENTS

| 2,533,339 A | 12/1950 | Willenborg | 177/311 |
| 2,640,667 A | 6/1953 | Winn | 248/65 |
| 2,883,489 A | 4/1959 | Eadie, Jr. et al. | 335/148 |
| 3,012,432 A | 12/1961 | Moore et al. | 73/40 |
| 3,218,863 A | 11/1965 | Calvert | 73/398 |
| 3,229,759 A | 1/1966 | Grover et al. | 165/105 |

(Continued)

FOREIGN PATENT DOCUMENTS

| CH | 672 368 A5 | 11/1989 |
| CN | 1130435 A | 9/1996 |

(Continued)

OTHER PUBLICATIONS

Second Office Action for the corresponding Chinese patent application No. 200680035248.5 dated Oct. 19, 2011, 22 pages.

(Continued)

*Primary Examiner* — Zhiyu Lu
(74) *Attorney, Agent, or Firm* — Westman, Champlin & Koehler, P.A.

(57) ABSTRACT

A wireless process communication adapter for field devices is provided. The adapter includes a metal housing having a first end and a second end. A chamber is defined between the first and second ends. A radio-frequency transparent radome is coupled to the first end. The second end has a field device coupling configured to attach to a field device. At least one circuit board is disposed within the chamber. The circuit board supports at least wireless process communication circuitry. A plurality of wires is coupled to the at least one circuit board and extends through the field device coupling. A silicone potting fills substantially all volume within the chamber not occupied by the at least one circuit board and wireless process communication circuitry.

14 Claims, 5 Drawing Sheets

(56) References Cited

U.S. PATENT DOCUMENTS

| | | | |
|---|---|---|---|
| 3,232,712 A | 2/1966 | Stearns | 23/255 |
| 3,249,833 A | 5/1966 | Vosteen | 317/246 |
| 3,374,112 A | 3/1968 | Danon | 117/226 |
| 3,557,621 A | 1/1971 | Ferran | 73/398 |
| 3,568,762 A | 3/1971 | Harbaugh | 165/105 |
| 3,612,851 A | 10/1971 | Fowler | 362/30 |
| 3,631,264 A | 12/1971 | Morgan | 327/309 |
| 3,633,053 A | 1/1972 | Peters et al. | 310/15 |
| 3,697,835 A | 10/1972 | Satori | 317/246 |
| D225,743 S | 1/1973 | Seltzer | D10/102 |
| 3,742,450 A | 6/1973 | Weller | 375/257 |
| 3,808,480 A | 4/1974 | Johnston | 317/256 |
| 3,881,962 A | 5/1975 | Rubinstein | 136/209 |
| 3,885,432 A | 5/1975 | Herzl | 73/861.22 |
| 3,924,219 A | 12/1975 | Braun | 338/34 |
| 3,931,532 A | 1/1976 | Byrd | 310/4 |
| 4,005,319 A | 1/1977 | Nilsson et al. | 310/8.3 |
| 4,008,619 A | 2/1977 | Alcaide et al. | 73/398 |
| 4,042,757 A | 8/1977 | Jones | 429/104 |
| 4,063,349 A | 12/1977 | Passler et al. | 29/627 |
| 4,084,155 A | 4/1978 | Herzl et al. | 340/870.39 |
| 4,116,060 A | 9/1978 | Frederick | 73/861.22 |
| 4,125,122 A | 11/1978 | Stachurski | 136/205 |
| 4,137,515 A * | 1/1979 | Akao | H01F 5/06 336/205 |
| 4,158,217 A | 6/1979 | Bell | 361/283 |
| 4,168,518 A | 9/1979 | Lee | 361/283 |
| 4,177,496 A | 12/1979 | Bell et al. | 361/283 |
| 4,227,419 A | 10/1980 | Park | 73/724 |
| 4,230,156 A * | 10/1980 | Frantz | F16K 31/0606 137/625.5 |
| 4,287,553 A | 9/1981 | Braunlich | 361/283 |
| 4,295,179 A * | 10/1981 | Read | 361/600 |
| 4,322,724 A | 3/1982 | Grudzinski | 340/595 |
| 4,322,775 A | 3/1982 | Delatorre | 361/283 |
| 4,336,567 A | 6/1982 | Anastasia | 361/283 |
| 4,358,814 A | 11/1982 | Lee et al. | 361/283 |
| 4,361,045 A | 11/1982 | Iwasaki | 73/654 |
| 4,370,890 A | 2/1983 | Frick | 73/718 |
| 4,383,801 A | 5/1983 | Pryor | 416/17 |
| 4,389,895 A | 6/1983 | Rud, Jr. | 73/724 |
| 4,390,321 A | 6/1983 | Langlois et al. | 417/15 |
| 4,422,125 A | 12/1983 | Antonazzi et al. | 361/283 |
| 4,422,335 A | 12/1983 | Ohnesorge et al. | 73/724 |
| 4,434,451 A | 2/1984 | Delatorre | 361/283 |
| 4,455,874 A | 6/1984 | Paros | 73/704 |
| 4,458,537 A | 7/1984 | Bell et al. | 73/718 |
| 4,459,537 A | 7/1984 | McWhorter | 323/224 |
| 4,475,047 A | 10/1984 | Ebert | 307/66 |
| 4,476,853 A | 10/1984 | Arbogast | 126/578 |
| 4,485,670 A | 12/1984 | Camarda et al. | 73/179 |
| 4,490,773 A | 12/1984 | Moffatt | 361/283 |
| 4,510,400 A | 4/1985 | Kiteley | 307/66 |
| 4,542,436 A | 9/1985 | Carusillo | 361/283 |
| 4,562,742 A | 1/1986 | Bell | 73/718 |
| 4,570,217 A | 2/1986 | Allen et al. | 700/19 |
| 4,590,466 A | 5/1986 | Wiklund et al. | 340/870.28 |
| 4,639,542 A | 1/1987 | Bass et al. | 136/210 |
| 4,670,733 A | 6/1987 | Bell | 338/36 |
| 4,701,938 A | 10/1987 | Bell | 375/257 |
| 4,704,607 A | 11/1987 | Teather et al. | 340/825.07 |
| 4,749,993 A | 6/1988 | Szabo et al. | 340/870.31 |
| 4,785,669 A | 11/1988 | Benson et al. | 73/718 |
| 4,860,232 A | 8/1989 | Lee et al. | 364/571.04 |
| 4,875,369 A | 10/1989 | Delatorre | 73/151 |
| 4,878,012 A | 10/1989 | Schulte et al. | 324/60 |
| 4,926,674 A | 5/1990 | Fossum et al. | 73/4 |
| 4,951,174 A | 8/1990 | Grantham et al. | 361/283.1 |
| 4,977,480 A | 12/1990 | Nishihara | 73/724 |
| 4,982,412 A | 1/1991 | Gross | 377/6 |
| 5,009,311 A * | 4/1991 | Schenk | H05K 3/284 206/706 |
| 5,014,176 A | 5/1991 | Kelleher et al. | 363/26 |
| 5,023,746 A | 6/1991 | Epstein | 361/56 |
| 5,025,202 A | 6/1991 | Ishii et al. | 220/101 |
| 5,045,963 A | 9/1991 | Hansen et al. | 361/87 |
| 5,060,295 A | 10/1991 | Borras et al. | 455/186 |
| 5,079,562 A | 1/1992 | Yarsunas et al. | 343/792 |
| 5,094,109 A | 3/1992 | Dean et al. | 73/718 |
| 5,107,366 A * | 4/1992 | Huang et al. | 359/223.1 |
| D331,370 S | 12/1992 | Williams | D10/46 |
| 5,168,419 A | 12/1992 | Delatorre | 361/283 |
| 5,170,671 A | 12/1992 | Miau et al. | 73/861.22 |
| 5,194,819 A | 3/1993 | Briefer | 73/718 |
| 5,223,763 A | 6/1993 | Chang | 310/339 |
| 5,230,250 A | 7/1993 | Delatorre | 73/733 |
| 5,233,875 A | 8/1993 | Obermeier et al. | 73/718 |
| D345,107 S | 3/1994 | Williams | D10/46 |
| 5,313,831 A | 5/1994 | Beckman | 73/204.24 |
| 5,329,818 A | 7/1994 | Frick et al. | 73/708 |
| 5,361,650 A * | 11/1994 | Klecker | F16H 61/0006 174/521 |
| 5,412,535 A | 5/1995 | Chao et al. | 361/700 |
| 5,492,016 A | 2/1996 | Pinto et al. | 73/724 |
| 5,495,769 A | 3/1996 | Broden et al. | 73/18 |
| 5,506,757 A | 4/1996 | Brorby | 361/796 |
| 5,531,936 A | 7/1996 | Kanatzidis et al. | 252/587 |
| 5,535,243 A | 7/1996 | Voegele et al. | 375/259 |
| 5,542,300 A | 8/1996 | Lee | 73/724 |
| 5,546,804 A | 8/1996 | Johnson et al. | 73/431 |
| 5,554,809 A | 9/1996 | Tobita et al. | 73/700 |
| 5,554,922 A | 9/1996 | Kunkel | 322/3 |
| 5,599,172 A | 2/1997 | McCabe | 417/334 |
| 5,606,513 A | 2/1997 | Louwagie et al. | 702/138 |
| 5,610,552 A | 3/1997 | Schlesinger et al. | 327/560 |
| 5,614,128 A | 3/1997 | Kanatzidis et al. | 252/582 |
| 5,618,471 A | 4/1997 | Kanatzidis et al. | 252/582 |
| 5,637,802 A | 6/1997 | Frick et al. | 73/724 |
| 5,642,301 A | 6/1997 | Warrior et al. | 364/571.02 |
| 5,644,185 A | 7/1997 | Miller | 310/306 |
| 5,656,782 A | 8/1997 | Powell, II et al. | 73/756 |
| 5,665,899 A | 9/1997 | Willcox | 731/1.63 |
| 5,672,832 A | 9/1997 | Cucci et al. | 73/861.52 |
| 5,682,476 A | 10/1997 | Tapperson et al. | 395/200.05 |
| 5,705,978 A | 1/1998 | Frick et al. | 340/511 |
| 5,710,552 A | 1/1998 | McCoy et al. | 340/870.21 |
| 5,722,249 A | 3/1998 | Miller, Jr. | 62/238.2 |
| 5,726,845 A | 3/1998 | Ho | 1/86 |
| 5,726,846 A | 3/1998 | Houbre | 361/93 |
| 5,754,419 A | 5/1998 | Ho | 3/89 |
| 5,757,608 A | 5/1998 | Bernot et al. | 361/283.4 |
| 5,764,891 A | 6/1998 | Warrior | 710/72 |
| 5,787,120 A | 7/1998 | Louagie et al. | 375/257 |
| 5,793,963 A | 8/1998 | Tapperson et al. | 395/200.31 |
| 5,803,604 A | 9/1998 | Pompei | 374/181 |
| 5,811,201 A | 9/1998 | Skowronski | 429/17 |
| 5,851,083 A | 12/1998 | Palan | 403/337 |
| 5,870,695 A | 2/1999 | Brown et al. | 702/138 |
| 5,872,494 A | 2/1999 | Palan et al. | 333/252 |
| 5,899,962 A | 5/1999 | Louwagie et al. | 702/138 |
| 5,911,162 A | 6/1999 | Denner | 73/718 |
| 5,929,372 A | 7/1999 | Oudoire et al. | 136/208 |
| 5,954,526 A | 9/1999 | Smith | 439/136 |
| 5,957,727 A | 9/1999 | Page, Jr. | 439/607.58 |
| 5,978,658 A | 11/1999 | Shoji | 455/66 |
| 5,992,240 A | 11/1999 | Tsuruoka et al. | 73/718 |
| 6,013,204 A | 1/2000 | Kanatzidis et al. | 252/584 |
| 6,020,648 A * | 2/2000 | MacPherson | H01L 23/24 257/787 |
| 6,038,927 A | 3/2000 | Karas | 73/706 |
| 6,062,095 A | 5/2000 | Mulrooney et al. | 73/866.5 |
| 6,079,276 A | 6/2000 | Frick et al. | 73/18 |
| 6,104,759 A | 8/2000 | Carkner et al. | 5/295 |
| 6,109,979 A | 8/2000 | Garnett | 439/709 |
| 6,126,327 A | 10/2000 | Bi et al. | 709/221 |
| 6,127,739 A | 10/2000 | Appa | 290/55 |
| 6,150,798 A | 11/2000 | Ferry et al. | 323/273 |
| D439,177 S | 3/2001 | Fandrey et al. | D10/46 |
| D439,178 S | 3/2001 | Fandrey et al. | D10/46 |
| D439,179 S | 3/2001 | Fandrey et al. | D10/46 |
| D439,180 S | 3/2001 | Fandrey et al. | D10/85 |
| D439,181 S | 3/2001 | Fandrey et al. | D10/46 |
| D441,672 S | 5/2001 | Fandrey et al. | D10/52 |
| 6,236,096 B1 | 5/2001 | Chang et al. | 257/419 |

(56) References Cited

U.S. PATENT DOCUMENTS

| | | | |
|---|---|---|---|
| 6,236,334 B1 | 5/2001 | Tapperson et al. | 340/825 |
| 6,255,010 B1 | 7/2001 | George et al. | 429/30 |
| 6,282,247 B1 | 8/2001 | Shen | 375/285 |
| 6,295,875 B1 | 10/2001 | Frick et al. | 73/718 |
| 6,312,617 B1 | 11/2001 | Kanatzidis et al. | 252/62.3 |
| 6,326,764 B1 | 12/2001 | Virtudes | 320/101 |
| 6,338,283 B1 | 1/2002 | Blazquez Navarro | 73/865.8 |
| 6,360,277 B1 | 3/2002 | Ruckley et al. | 709/250 |
| 6,366,436 B1 | 4/2002 | Maier et al. | 361/93.9 |
| 6,385,972 B1 | 5/2002 | Fellows | 60/517 |
| 6,405,139 B1 | 6/2002 | Kicinski et al. | 702/33 |
| 6,429,786 B1 | 8/2002 | Bansemir et al. | 340/870.27 |
| 6,441,747 B1 | 8/2002 | Khair et al. | 340/870.16 |
| 6,457,367 B1 | 10/2002 | Behm et al. | 73/753 |
| 6,480,699 B1 | 11/2002 | Lovoi | 455/41.2 |
| 6,484,107 B1 | 11/2002 | Roper et al. | 702/50 |
| 6,487,912 B1 | 12/2002 | Behm et al. | 73/753 |
| 6,504,489 B1 | 1/2003 | Westfield et al. | 340/870.3 |
| 6,508,131 B2 | 1/2003 | Frick | 73/756 |
| 6,510,740 B1 | 1/2003 | Behm et al. | 73/708 |
| 6,511,337 B1 | 1/2003 | Fandrey et al. | 439/320 |
| D471,829 S | 3/2003 | Dennis et al. | D10/85 |
| D472,831 S | 4/2003 | Dennis et al. | D10/85 |
| 6,546,805 B2 | 4/2003 | Fandrey et al. | 73/753 |
| 6,553,076 B1 | 4/2003 | Huang | 375/257 |
| 6,563,908 B1 * | 5/2003 | Enck, Jr. | 378/123 |
| 6,568,279 B2 | 5/2003 | Behm et al. | 73/753 |
| 6,571,132 B1 | 5/2003 | Davis et al. | 700/2 |
| 6,574,515 B1 | 6/2003 | Kirkpatrick et al. | 700/19 |
| 6,593,857 B1 | 7/2003 | Roper et al. | 340/870.3 |
| 6,609,427 B1 | 8/2003 | Westfield et al. | 73/753 |
| 6,640,308 B1 | 10/2003 | Keyghobad et al. | 713/300 |
| 6,661,220 B1 | 12/2003 | Glehr | 324/207.17 |
| 6,662,662 B1 | 12/2003 | Nord et al. | 73/715 |
| 6,667,594 B2 | 12/2003 | Chian | 318/696 |
| 6,680,690 B1 | 1/2004 | Nilsson et al. | 342/124 |
| 6,690,182 B2 | 2/2004 | Kelly et al. | 324/700 |
| 6,711,446 B2 | 3/2004 | Kirkpatrick et al. | 700/19 |
| 6,747,573 B1 | 6/2004 | Gerlach et al. | 340/870.21 |
| 6,765,968 B1 | 7/2004 | Nelson et al. | 375/257 |
| 6,771,560 B2 | 8/2004 | Lyon et al. | 367/13 |
| 6,774,814 B2 | 8/2004 | Hilleary | 340/870.07 |
| 6,778,100 B2 | 8/2004 | Schempf | 340/870.07 |
| 6,792,259 B1 | 9/2004 | Parise | 455/343.1 |
| 6,823,072 B1 | 11/2004 | Hoover | 381/7 |
| 6,838,859 B2 | 1/2005 | Shah | 322/38 |
| 6,839,546 B2 | 1/2005 | Hedtke | 455/67.11 |
| 6,839,790 B2 | 1/2005 | Barros De Almeida et al. | 710/305 |
| 6,843,110 B2 | 1/2005 | Deane et al. | 73/114.35 |
| 6,891,477 B2 | 5/2005 | Aronstam | 340/606 |
| 6,891,838 B1 | 5/2005 | Petite et al. | 370/401 |
| 6,898,980 B2 | 5/2005 | Behm et al. | 73/756 |
| 6,904,295 B2 | 6/2005 | Yang | 455/522 |
| 6,907,383 B2 | 6/2005 | Eryurek et al. | 702/183 |
| 6,910,332 B2 | 6/2005 | Fellows | 60/520 |
| 6,942,728 B2 | 9/2005 | Caillat et al. | 117/3 |
| 6,961,665 B2 | 11/2005 | Slezak | 702/61 |
| 6,984,899 B1 | 1/2006 | Rice | 290/44 |
| 6,995,677 B2 | 2/2006 | Aronstam et al. | 340/606 |
| 6,995,685 B2 | 2/2006 | Randall | 340/870.39 |
| 7,010,294 B1 | 3/2006 | Pyotsia et al. | 455/420 |
| 7,036,983 B2 | 5/2006 | Green et al. | 374/179 |
| 7,043,250 B1 | 5/2006 | DeMartino | 455/445 |
| 7,058,542 B2 | 6/2006 | Hauhia et al. | 702/183 |
| 7,073,394 B2 | 7/2006 | Foster | 73/861.22 |
| 7,085,610 B2 | 8/2006 | Eryurek et al. | 700/29 |
| 7,088,285 B2 | 8/2006 | Smith | 342/124 |
| 7,109,883 B2 | 9/2006 | Trimble et al. | 340/870.16 |
| 7,116,036 B2 | 10/2006 | Balasubramaniam et al. | 310/322 |
| 7,129,663 B2 | 10/2006 | Suzuki | 318/504 |
| 7,136,725 B1 | 11/2006 | Paciorek et al. | 700/295 |
| 7,173,343 B2 | 2/2007 | Kugel | 290/1 R |
| 7,197,953 B2 | 4/2007 | Olin | 73/866.5 |
| 7,233,745 B2 | 6/2007 | Loechner | 398/128 |
| 7,262,693 B2 | 8/2007 | Karschnia et al. | 340/508 |
| 7,271,679 B2 | 9/2007 | Lundberg et al. | 333/24 |
| 7,301,454 B2 | 11/2007 | Seyfang et al. | 340/539.26 |
| 7,319,191 B2 | 1/2008 | Poon et al. | 174/50.62 |
| 7,329,959 B2 | 2/2008 | Kim et al. | 290/2 |
| 7,351,098 B2 | 4/2008 | Gladd et al. | 439/578 |
| 7,504,807 B2 | 3/2009 | Kataoka | 323/268 |
| 7,518,553 B2 | 4/2009 | Zhang et al. | 343/700 MS |
| 7,539,593 B2 | 5/2009 | Machacek | 702/127 |
| 7,560,907 B2 | 7/2009 | Nelson | 322/37 |
| 7,626,141 B2 | 12/2009 | Rodriguez-Medina et al. | 219/260 |
| 7,680,460 B2 | 3/2010 | Nelson et al. | 455/67.11 |
| 7,726,017 B2 | 6/2010 | Evans et al. | 29/854 |
| 7,835,119 B2 | 11/2010 | Florence et al. | 361/18 |
| 7,983,049 B2 | 7/2011 | Leifer et al. | 361/728 |
| 8,005,514 B2 | 8/2011 | Saito et al. | 455/572 |
| 8,150,462 B2 | 4/2012 | Guenter et al. | 455/557 |
| 8,160,535 B2 | 4/2012 | Kielb et al. | 455/343 |
| 8,180,948 B2 | 5/2012 | Kreider et al. | 710/313 |
| 8,208,581 B2 | 6/2012 | Westfield et al. | 375/295 |
| 8,452,255 B2 | 5/2013 | Orth | 455/343.5 |
| 8,538,560 B2 | 9/2013 | Brown et al. | 700/22 |
| 2001/0025349 A1 | 9/2001 | Sharood et al. | 713/340 |
| 2002/0011115 A1 | 1/2002 | Frick | 73/718 |
| 2002/0029130 A1 | 3/2002 | Eryurek et al. | 702/183 |
| 2002/0029900 A1 * | 3/2002 | Wimberger Friedl et al. | 174/258 |
| 2002/0065631 A1 | 5/2002 | Loechner | 702/188 |
| 2002/0082799 A1 | 6/2002 | Pramanik | 702/130 |
| 2002/0095520 A1 | 7/2002 | Wettstein et al. | 709/253 |
| 2002/0097031 A1 | 7/2002 | Cook et al. | 323/273 |
| 2002/0105968 A1 | 8/2002 | Pruzan et al. | 370/465 |
| 2002/0148236 A1 | 10/2002 | Bell | 62/3.3 |
| 2002/0163323 A1 | 11/2002 | Kasai et al. | 323/284 |
| 2003/0032993 A1 | 2/2003 | Mickle et al. | 600/509 |
| 2003/0042740 A1 | 3/2003 | Holder et al. | 290/1 A |
| 2003/0043052 A1 | 3/2003 | Tapperson et al. | 640/825.37 |
| 2003/0079553 A1 | 5/2003 | Cain et al. | 73/861.27 |
| 2003/0083038 A1 | 5/2003 | Poon et al. | 455/344 |
| 2003/0097521 A1 | 5/2003 | Pfandler et al. | 711/103 |
| 2003/0134161 A1 | 7/2003 | Gore et al. | 429/12 |
| 2003/0143958 A1 | 7/2003 | Elias et al. | 455/73 |
| 2003/0167631 A1 | 9/2003 | Hallenbeck | 29/835 |
| 2003/0171827 A1 | 9/2003 | Keyes et al. | 700/19 |
| 2003/0199778 A1 | 10/2003 | Mickle et al. | 600/509 |
| 2003/0204371 A1 | 10/2003 | Sciamanna | 702/183 |
| 2004/0081872 A1 | 4/2004 | Herman et al. | 429/26 |
| 2004/0085240 A1 | 5/2004 | Faust | 342/124 |
| 2004/0086021 A1 | 5/2004 | Litwin | 374/120 |
| 2004/0124854 A1 | 7/2004 | Slezak | 324/644 |
| 2004/0142733 A1 | 7/2004 | Parise | 455/572 |
| 2004/0159235 A1 | 8/2004 | Marganski et al. | 95/116 |
| 2004/0183550 A1 | 9/2004 | Fehrenbach et al. | 27/26 |
| 2004/0184517 A1 | 9/2004 | Westfield et al. | 375/219 |
| 2004/0199681 A1 | 10/2004 | Hedtke | 710/37 |
| 2004/0200519 A1 | 10/2004 | Sterzel et al. | 136/238 |
| 2004/0203421 A1 | 10/2004 | Hedtke | 455/67.11 |
| 2004/0203434 A1 | 10/2004 | Karschnia et al. | 455/67.11 |
| 2004/0211456 A1 | 10/2004 | Brown et al. | 136/243 |
| 2004/0214543 A1 | 10/2004 | Osone et al. | 455/197.2 |
| 2004/0218326 A1 | 11/2004 | Duren et al. | 361/93.1 |
| 2004/0242169 A1 | 12/2004 | Albsmeier et al. | 455/91 |
| 2004/0249483 A1 | 12/2004 | Wojsznis et al. | 700/52 |
| 2004/0259533 A1 | 12/2004 | Nixon et al. | 455/414.1 |
| 2005/0011278 A1 | 1/2005 | Brown et al. | 73/861.18 |
| 2005/0017602 A1 | 1/2005 | Arms et al. | 310/339 |
| 2005/0023858 A1 | 2/2005 | Bingle et al. | 296/76 |
| 2005/0029236 A1 | 2/2005 | Gambino et al. | 219/121.69 |
| 2005/0040570 A1 | 2/2005 | Asselborn | 266/99 |
| 2005/0046595 A1 | 3/2005 | Blyth | 340/908 |
| 2005/0056106 A1 | 3/2005 | Nelson et al. | 73/866.3 |
| 2005/0072239 A1 | 4/2005 | Longsdorf et al. | 73/649 |
| 2005/0074324 A1 | 4/2005 | Yoo | 415/4.3 |
| 2005/0076944 A1 | 4/2005 | Kanatzidis et al. | 136/239 |
| 2005/0082949 A1 | 4/2005 | Tsujiura | 310/339 |
| 2005/0099010 A1 | 5/2005 | Hirsch | 290/42 |
| 2005/0106927 A1 | 5/2005 | Goto et al. | 439/404 |

(56) References Cited

U.S. PATENT DOCUMENTS

| | | | |
|---|---|---|---|
| 2005/0109395 A1 | 5/2005 | Seberger | 137/8 |
| 2005/0115601 A1 | 6/2005 | Olsen et al. | 136/212 |
| 2005/0118468 A1 | 6/2005 | Adams et al. | 429/22 |
| 2005/0122653 A1 | 6/2005 | McCluskey et al. | 361/92 |
| 2005/0130605 A1 | 6/2005 | Karschnia et al. | 455/90.3 |
| 2005/0132808 A1 | 6/2005 | Brown et al. | 73/592 |
| 2005/0134148 A1 | 6/2005 | Buhler et al. | 310/339 |
| 2005/0139250 A1 | 6/2005 | DeSteese et al. | 136/212 |
| 2005/0146220 A1 | 7/2005 | Hamel et al. | 307/44 |
| 2005/0153593 A1 | 7/2005 | Takayanagi et al. | 439/352 |
| 2005/0164684 A1 | 7/2005 | Chen et al. | 455/414.1 |
| 2005/0197803 A1 | 9/2005 | Eryurek et al. | 702/185 |
| 2005/0201349 A1 | 9/2005 | Budampati | 370/342 |
| 2005/0208908 A1 | 9/2005 | Karschnia et al. | 455/127.1 |
| 2005/0222698 A1 | 10/2005 | Eryurek et al. | 700/90 |
| 2005/0228509 A1 | 10/2005 | James | 700/19 |
| 2005/0235758 A1 | 10/2005 | Kowal et al. | 73/891.29 |
| 2005/0242979 A1 | 11/2005 | Hamilton et al. | 341/144 |
| 2005/0245291 A1 | 11/2005 | Brown et al. | 455/572 |
| 2005/0276233 A1 | 12/2005 | Shepard et al. | 370/254 |
| 2005/0281215 A1 | 12/2005 | Budampati et al. | 370/328 |
| 2005/0289276 A1 | 12/2005 | Karschnia et al. | 710/305 |
| 2006/0002368 A1 | 1/2006 | Budampati et al. | 370/351 |
| 2006/0028327 A1 | 2/2006 | Amis | 340/431 |
| 2006/0036404 A1 | 2/2006 | Wiklund et al. | 702/183 |
| 2006/0047480 A1 | 3/2006 | Lenz et al. | 702/183 |
| 2006/0058847 A1 | 3/2006 | Lenz et al. | 607/5 |
| 2006/0060236 A1 | 3/2006 | Kim et al. | 136/203 |
| 2006/0063522 A1 | 3/2006 | McFarland | 455/423 |
| 2006/0077917 A1 | 4/2006 | Brahmajosyula et al. | 370/310 |
| 2006/0092039 A1 | 5/2006 | Saito et al. | 340/825.37 |
| 2006/0111058 A1 | 5/2006 | Grant et al. | 455/127.1 |
| 2006/0116102 A1 | 6/2006 | Brown et al. | |
| 2006/0128689 A1 | 6/2006 | Gomtsyan et al. | 514/217.01 |
| 2006/0131428 A1 | 6/2006 | Wang et al. | 235/492 |
| 2006/0142875 A1 | 6/2006 | Keyes, IV et al. | 700/1 |
| 2006/0148410 A1 | 7/2006 | Nelson et al. | 455/67.11 |
| 2006/0181406 A1 | 8/2006 | Petite et al. | 340/521 |
| 2006/0194547 A1 | 8/2006 | Davis | 455/69 |
| 2006/0227729 A1 | 10/2006 | Budampati et al. | 370/278 |
| 2006/0274644 A1 | 12/2006 | Budampati et al. | 370/216 |
| 2006/0274671 A1 | 12/2006 | Budampati et al. | 370/254 |
| 2006/0278023 A1 | 12/2006 | Garneyer et al. | 73/862.333 |
| 2006/0282580 A1 | 12/2006 | Russell et al. | 710/62 |
| 2006/0287001 A1 | 12/2006 | Budampati et al. | 455/552.1 |
| 2006/0290328 A1 | 12/2006 | Orth | 323/218 |
| 2007/0006528 A1 | 1/2007 | Diebold et al. | 48/197 R |
| 2007/0024256 A1 | 2/2007 | Chou | 323/268 |
| 2007/0030816 A1 | 2/2007 | Kolavennu | 370/252 |
| 2007/0030832 A1 | 2/2007 | Gonia et al. | 370/328 |
| 2007/0039371 A1 | 2/2007 | Omata et al. | 73/9 |
| 2007/0054630 A1 | 3/2007 | Scheible et al. | 455/90.3 |
| 2007/0055463 A1 | 3/2007 | Florenz et al. | 702/50 |
| 2007/0079250 A1 | 4/2007 | Bump et al. | 715/762 |
| 2007/0135867 A1 | 6/2007 | Klosterman et al. | 607/60 |
| 2007/0229255 A1 | 10/2007 | Loechner | 340/540 |
| 2007/0233283 A1 | 10/2007 | Chen | 700/17 |
| 2007/0237137 A1 | 10/2007 | McLaughlin | 370/389 |
| 2007/0273496 A1 | 11/2007 | Hedtke | 340/506 |
| 2007/0275755 A1 | 11/2007 | Chae et al. | 455/557 |
| 2007/0279009 A1 | 12/2007 | Kobayashi | 320/166 |
| 2007/0280144 A1 | 12/2007 | Hodson et al. | 370/312 |
| 2007/0280178 A1 | 12/2007 | Hodson et al. | 370/338 |
| 2007/0280286 A1 | 12/2007 | Hodson et al. | 370/466 |
| 2007/0280287 A1 | 12/2007 | Samundrala et al. | 370/466 |
| 2007/0282463 A1 | 12/2007 | Hodson et al. | 700/20 |
| 2007/0285224 A1 | 12/2007 | Karschnia et al. | 340/538 |
| 2007/0288204 A1 | 12/2007 | Gienke et al. | 702/188 |
| 2008/0010600 A1 | 1/2008 | Katano | 715/748 |
| 2008/0030423 A1 | 2/2008 | Shigemoto | 343/872 |
| 2008/0054645 A1 | 3/2008 | Kulkarni et al. | |
| 2008/0079641 A1 | 4/2008 | Grunig et al. | |
| 2008/0083446 A1 | 4/2008 | Chakraborty et al. | 136/205 |
| 2008/0088464 A1 | 4/2008 | Gutierrez | 340/606 |
| 2008/0114911 A1 | 5/2008 | Schumacher | 710/72 |
| 2008/0123581 A1 | 5/2008 | Wells et al. | |
| 2008/0141769 A1 | 6/2008 | Schmidt et al. | 73/204.19 |
| 2008/0145007 A1* | 6/2008 | Crumpton | G02B 6/4201 385/94 |
| 2008/0268784 A1 | 10/2008 | Kantzes et al. | 455/66.1 |
| 2008/0273486 A1 | 11/2008 | Pratt et al. | 370/328 |
| 2008/0280568 A1* | 11/2008 | Kielb et al. | 455/74.1 |
| 2008/0310195 A1 | 12/2008 | Seberger et al. | 363/26 |
| 2009/0015216 A1 | 1/2009 | Seberger et al. | 323/234 |
| 2009/0046732 A1 | 2/2009 | Pratt et al. | 370/406 |
| 2009/0066587 A1 | 3/2009 | Hayes et al. | 343/702 |
| 2009/0081957 A1 | 3/2009 | Sinreich | 455/68 |
| 2009/0083001 A1 | 3/2009 | Huisenga et al. | 702/185 |
| 2009/0102449 A1 | 4/2009 | Chang et al. | 323/311 |
| 2009/0120169 A1 | 5/2009 | Chandler et al. | 73/54.41 |
| 2009/0145656 A1* | 6/2009 | Tschudin | 174/521 |
| 2009/0146502 A1 | 6/2009 | Sinreich | 307/104 |
| 2009/0167613 A1 | 7/2009 | Hershey et al. | 343/702 |
| 2009/0195222 A1 | 8/2009 | Lu et al. | 322/3 |
| 2009/0200489 A1 | 8/2009 | Tappel et al. | 250/492.3 |
| 2009/0250340 A1 | 10/2009 | Sasaki et al. | 204/298.02 |
| 2009/0253388 A1 | 10/2009 | Kielb et al. | 455/117 |
| 2009/0260438 A1 | 10/2009 | Hedtke | 73/579 |
| 2009/0309558 A1 | 12/2009 | Kielb | 323/234 |
| 2009/0311975 A1 | 12/2009 | Vanderaa et al. | 455/90.3 |
| 2009/0311976 A1 | 12/2009 | Vanderaa et al. | 455/90.3 |
| 2009/1311971 | 12/2009 | Kielb et al. | 455/74.1 |
| 2010/0000316 A1 | 1/2010 | Fehrenbach et al. | 73/295 |
| 2010/0109331 A1 | 5/2010 | Hedtke et al. | |
| 2010/0156175 A1 | 6/2010 | Wei | 307/31 |
| 2010/0254900 A1* | 10/2010 | Campbell et al. | 424/1.65 |
| 2011/0053526 A1 | 3/2011 | Strei et al. | 455/90.3 |
| 2012/0129590 A1 | 5/2012 | Morrisroe | 463/25 |
| 2012/0299564 A1 | 11/2012 | Howes et al. | 323/281 |
| 2013/0079895 A1 | 3/2013 | Hedtke | 700/9 |
| 2013/0207624 A1 | 8/2013 | Aaltonen et al. | 323/234 |

FOREIGN PATENT DOCUMENTS

| | | |
|---|---|---|
| CN | 1251953 | 5/2000 |
| CN | 1 429 354 A | 7/2003 |
| CN | 1 442 822 A | 9/2003 |
| CN | 100386602 C | 4/2005 |
| CN | 1969238 | 5/2007 |
| CN | 101821686 | 9/2010 |
| CN | 102067048 | 5/2011 |
| CN | 202694194 | 1/2013 |
| DE | 2710211 | 9/1978 |
| DE | 3340834 A1 | 5/1985 |
| DE | 3842379 | 6/1990 |
| DE | 196 22 295 | 5/1996 |
| DE | 201 07 112 U1 | 7/2001 |
| DE | 101 04 582 A1 | 10/2001 |
| DE | 100 41 160 | 3/2002 |
| DE | 102 21 931 A1 | 5/2002 |
| DE | 10 2004 020 393 | 11/2005 |
| EP | 0 518 916 B1 | 2/1991 |
| EP | 0 524 550 A1 | 7/1992 |
| EP | 0729294 | 8/1996 |
| EP | 0 895 209 A1 | 2/1999 |
| EP | 0 945 714 | 9/1999 |
| EP | 1 202 145 A1 | 5/2002 |
| EP | 1 192 614 | 1/2003 |
| EP | 1 293 853 A1 | 3/2003 |
| EP | 1879294 | 1/2008 |
| FI | 118699 B | 2/2008 |
| GB | 1 397 435 A | 6/1975 |
| GB | 2 403 043 | 6/2004 |
| JP | 01121236 | 5/1989 |
| JP | 01121236 | 8/1989 |
| JP | 2-35803 | 2/1990 |
| JP | 02067794 | 7/1990 |
| JP | 4-335796 | 11/1992 |
| JP | 06 199284 A | 7/1994 |
| JP | 8-125767 | 5/1996 |
| JP | 8-249997 A | 9/1996 |
| JP | 9-065441 | 3/1997 |
| JP | 09-182308 | 7/1997 |
| JP | 11-257196 | 9/1999 |

(56) References Cited

FOREIGN PATENT DOCUMENTS

| | | |
|---|---|---|
| JP | 11-257196 A | 9/1999 |
| JP | 2001-524226 | 11/2001 |
| JP | 2002369554 | 12/2002 |
| JP | 2003/042881 | 2/2003 |
| JP | 2003-051894 | 2/2003 |
| JP | 2003051894 | 2/2003 |
| JP | 2003134261 | 5/2003 |
| JP | 2003-195903 | 7/2003 |
| JP | 2004021877 | 1/2004 |
| JP | 2004 146254 | 5/2004 |
| JP | 2004208476 | 7/2004 |
| JP | 2004-317593 | 11/2004 |
| JP | 2005-505822 | 2/2005 |
| JP | 2005-122744 | 5/2005 |
| JP | 2005-207648 | 7/2005 |
| JP | 2006-014589 | 1/2006 |
| JP | 2006-180603 | 7/2006 |
| JP | 2007-200940 | 8/2007 |
| JP | 2008-17663 | 1/2008 |
| JP | 2008-504790 | 2/2008 |
| JP | 2008-511938 | 4/2008 |
| JP | 2008-527493 | 7/2008 |
| JP | 2009-106145 | 5/2009 |
| JP | 2010-530211 | 9/2010 |
| JP | 2010-541099 | 12/2010 |
| RU | 2 131 934 C1 | 6/1999 |
| RU | 2168062 | 5/2001 |
| RU | 2342639 C2 | 8/2003 |
| RU | 2003128989 | 1/2007 |
| WO | WO 91/13417 | 9/1991 |
| WO | WO 95/07522 | 3/1995 |
| WO | WO 96/12993 | 5/1996 |
| WO | 99/53286 | 10/1999 |
| WO | WO 01/01742 | 1/2001 |
| WO | WO 01/48723 | 7/2001 |
| WO | WO 01/51836 | 7/2001 |
| WO | WO 01/76148 | 10/2001 |
| WO | WO 02/05241 | 1/2002 |
| WO | WO 03/023536 | 3/2003 |
| WO | WO 03/089881 | 10/2003 |
| WO | WO 2004/038998 | 5/2004 |
| WO | 2004/082051 A1 | 9/2004 |
| WO | WO 2004/094892 | 11/2004 |
| WO | WO 2005/060482 | 7/2005 |
| WO | 2005/086331 A2 | 9/2005 |
| WO | WO 2006/026749 | 3/2006 |
| WO | WO 2006/109362 | 10/2006 |
| WO | 2007/002769 A1 | 1/2007 |
| WO | WO 2007/031435 | 3/2007 |
| WO | WO 2007/037988 | 4/2007 |
| WO | 2008/098583 A1 | 8/2008 |
| WO | WO 2009/003146 | 12/2008 |
| WO | WO 2009/003148 | 12/2008 |
| WO | 2009/063056 A1 | 5/2009 |

OTHER PUBLICATIONS

First Office Action from the corresponding Chinese patent application No. 200980122611.0 dated Nov. 23, 2011.
Official Action for the corresponding Russian patent application No. 2011101386 transmitted Dec. 23, 2011.
Office Action from Chinese Patent Application No. 200880110323.9, dated Jan. 29, 2012.
Written Opinion from Singapore Patent Application No. 201009093-4, dated Feb. 20, 2012.
Written Opinion and Search Report from the related Singapore patent application No. 201009226-0 dated Mar. 16, 2012.
Office Action from the related Russian patent application No. 2011101364 Feb. 8, 2012.
Communication Pursuant to Rules 161(1) and 162 EPC for application Serial No. EP 09767062.4, dated Jan. 27, 2011.
Office Action from Chinese Application No. 200980122611.0 dated Nov. 23, 2011, 5 pgs.
The International Search Report from PCT Application No. PCT/US2011/047026, dated Jul. 11, 2011, 4 pgs.
The Written Opinion from International Search Report from PCT Application No. PCT/US2011/047026, dated Jul. 11, 2011, 8 pgs.
Office Action from related European Application No. EP 09767062.4, dated Jul. 13, 2011, 5 pgs.
Communication Pursuant to Rules 161(1) and 162 EPC for application Serial No. EP 10752246.8, dated May 3, 2012.
Written Opinion for the related Singapore patent application No. 2010092278 dated Feb. 16, 2012.
Written Opinion for the related Singapore patent application No. 2010092245 dated Jan. 6, 2012.
Japanese Office Action from JP 2011-514605, dated Jun. 19, 2012.
Communication Pursuant to Rules 161(1) and 162 EPC for application Serial No. EP 10765871.8, dated Apr. 27, 2012.
Office Action from Russian patent application No. 2011101386 dated Apr. 23, 2012, 4 pages.
Office Action from related European Application No. EP 09767062.4, dated Jul. 13, 2011, 5pgs.
Chinese Office Action from CN200980122835.1, dated Jul. 3, 2012.
Chinese Office Action from CN200980122761.1, dated Aug. 31, 2012.
First Office Action from Japanese patent application No. 2011514603, dated Jul. 10, 212.
First Office Action from Chinese patent application No. 200980122613.X, dated Aug. 15, 2012.
Second Office Action from Chinese patent application No. 200980122611.0 dated Aug. 20, 2012.
Official Action from Canadian patent application No. 2563337 dated Sep. 4, 2012.
Notification of Transmittal of the International Search Report and the Written Opinion for the international patent application No. PCT/US2010/047463 dated Dec. 1, 2010.
Notification of Transmittal of the International Search Report and the Written Opinion for the international patent application No. PCT/US2010/047444 dated Dec. 10, 2010.
Decision on Refusal to Grant from Russian patent application No. 2006145434 dated Feb. 18, 2011.
U.S. Appl. No. 12/855,128, filed Aug. 12, 2010.
U.S. Appl. No. 12/870,448, filed Aug. 17, 2010.
Office Action from Chinese patent Application No. 200580006438.X transmitted Jul. 9, 2008.
Examiner's Consultation from European patent Application No. 05724190.3, dated Jun. 30, 2008.
The second Office Action from Chinese patent Application No. 2005800142124 filed May 5, 2005.
First Office Action from Russian patent application No. 2006145434 dated Oct. 5, 2007.
Office Action from European Application No. 05746241.8, dated Aug. 29, 2007.
Decision on refusal to grant a patent for invention for Russian patent application No. 2006145434, filed May 5, 2005.
"Wireless R&D Aims to Boost Traffic," by M. Moore, InTech with Industrial Computing, Feb. 2002, pp. 40-41.
"System Checks Faraway Machines' Health," by J. Strothman, InTech with Industrial Computing, Feb. 2002, pp. 42-43.
"Wireless Management Toolkit XYR 5000", by Honeywell International Inc., Phoenix, Arizona, 3 pgs., Oct. 2003.
"Wireless Analog Input Transmitters XYR 5000", by Honeywell International Inc., Phoenix, Arizona, 4 pgs., Oct. 2003.
"Quad Analog Output Module Installation and User's Manual", by Honeywell International Inc., Phoenix, Arizona, pp. ii, iii, iv and 1-12, Dec. 2003.
"Wireless Dual Analog Input Interface Transmitter Installation and User's Manual", by Honeywell International Inc., Phoenix, Arizona, pp. ii-vi and 7-43, Dec. 2003.
"XYR 5000 Wireless Dual Analog Input Interface, Model Selection Guide", by Honeywell International Inc., Phoenix, Arizona, Dec. 2003.
"Wireless Measure, Monitor & Control", by Accutech, 4 pgs. May 2003.
"Wireless Instrumentation, Multi-Input Field Unit", by Accutech, 2 pgs., Dec. 2003.

(56) References Cited

OTHER PUBLICATIONS

"Quad Analog Output Module", by Accutech, 1 pg. Dec. 2003.
3 Pages from Website www.chemicalprocessing.com, Apr. 2004.
2002 Microchip Technology Inc., "Stand-Alone CAN Controller with SPI™ Interface," pp. 1-75, Mar. 1, 2002.
"Mechatronic Drives in Mobile Hydraulics," Internet Article, Soncebox News. No. 4, Oct. 2004.
"Every Little Helps," Economist, vol. 278, No. 8469, p. 78, Mar. 18, 2006.
"Thermal Design and Heat Sink Manufacturing & Testing—Total Thermal and Heat Sink . . . ," http://www.enertron-inc.com/enertron-products/integrated-heat-sink.php, Mar. 31, 2006.
Zahnd et al., "Piezoelectric Windmill: A Novel Solution to Remote Sensing," Japanese Journal of Applied Physics, v. 44, No. 3, p. L104-L105, 2005.
"Heat Pipe—Wikipedia, the free encyclopedia," http://en.wikipedia.org/wiki/Heat_pipe, Mar. 31, 2006.
"High Power Single PSE Controller With Internal Switch," Linear Technology LTC4263-1, p. 1-20.
First Office Action dated Nov. 4, 2013 from the SIPO in China in related Chinese patent application No. 201080012850.3. 13 pgs. With English translation.
Third Office Action dated Sep. 24, 2013 for Chinese Appln. No. 200980122835.1, 21 pgs. including English translation.
Examination Report for the related Singapore application No. 201009226-0 dated Oct. 12, 2012.
Chinese Office Action from CN200980122761.1, dated Dec. 12, 2013.
3$^{rd}$ Office Action dated Jan. 17, 2014 in Chinese Patent Application No. 200980122613.X, 9 pgs including English translation.
Office Action from Chinese patent 201210057973.X dated Jul. 31, 2014.
Office Action U.S. Appl. No. 12/485,169, dated May 2, 2013.
Office Action U.S. Appl. No. 12/485,169, dated Feb. 8, 2012.
Office Action U.S. Appl. No. 12/485,169, dated Sep. 12, 2011.
Communication from European Patent Application No. 10752246.8, dated Sep. 8, 2015.
International Search Report and Written Opinion from PCT/US2009/003621, dated Sep. 30, 2009.
Communication from European Patent Application No. 09767063.2, dated Jan. 28, 2011.
Office Action from Canadian Patent Application No. 2,726,608, dated Dec. 5, 2012.
Office Action from Singapore Patent Application No. 2010092278, dated Jan. 7, 2013.
Office Action from Japanese Patent Application No. 2012-527988, dated May 14, 2013.
International Search Report and Written Opinion from PCT/US2010/047444, dated Dec. 10, 2010.
Office Action from Japanese Patent Application No. 2012-527994, dated Jun. 11, 2013.
Office Action from Japanese Patent Application No. 2013-524161, dated Dec. 2, 2014.
Communication from EP Application No. 12787964.1, dated Mar. 9, 2015.
Office Action from Japanese Patent Application No. 2014-538858, dated Apr. 7, 2015.
Office Action from Chinese Patent Application No. 201210042907.5, dated May 14, 2015.
Office Action from European Patent Application No. 11754949.3, dated Sep. 7, 2015.
Office Action from Canadian Patent Application No. 2,808,174, dated Oct. 2, 2015.
Office Action from Japanese Patent Application No. 2013-524161, dated Nov. 24, 2015.
Office Action from Chinese Patent Application No. 201210042907.5, dated Nov. 3, 2015.

* cited by examiner

WIRELESS PROCESS COMMUNICATION ADAPTER WITH IMPROVED ENCAPSULATION

CROSS-REFERENCE TO RELATED APPLICATION

The present application is based on and claims the benefit of U.S. provisional patent application Ser. No. 61/239,116 filed Sep. 2, 2009; and the present application is a continuation-in-part application of U.S. patent application Ser. No. 12/485,169, dated Jun. 16, 2009, the contents of which applications are hereby incorporated by reference in their entireties.

BACKGROUND

In industrial settings, control systems are used to monitor and control inventories of industrial and chemical processes and the like. Typically, the control system performs these functions using field devices distributed at key locations in the industrial process and coupled to control circuitry in the control room by a process control loop. The term "field device" refers to any device that performs a function in a distributed control or process monitoring system including all devices currently known, or yet to be known, used in the measurement, control, and monitoring of industrial processes.

Some field devices include a transducer. A transducer is understood to mean either a device that generates an output signal based on a physical input or that generates a physical output based on an input signal. Typically, transducers transform an input into an output having different form. Types of transducers include various analytical sensors, pressure sensors, thermistors, thermocouples, strain gauges, level sensors, digital valve controllers, flowmeters, flow computers, positioners, actuators, solenoids, indicator lights, and others.

Typically, each field device also includes communication circuitry that is used for communicating with a process control room or other circuitry over a process control loop. In some installations, the process control loop is also used to deliver a regulated current and/or voltage to the field device for powering the field device. Process control loops also carry data or a signal indicative of a process variable, either in an analog or digital format.

Traditionally, analog field devices have been connected to the control room by two-wire process control current loops with each device connected to the control room by a single two-wire control loop. Typically, a voltage differential is maintained between the two wires within a range of voltages from 12-45 volts for analog mode and 9-50 for digital mode. Some analog field devices transmit a signal to the control room by modulating the current running through the current loop to a current that is proportional to the sensed process variable. Other analog field devices can perform an action under the control of the control room by controlling the magnitude of the current through the loop. In addition to, or in the alternative, the process control loop can also carry digital signals used for communication with field devices.

In some installations, wireless technologies have begun to be used to communicate with field devices. Wireless operation simplifies field device wiring and setup. However, the majority of field devices are hardwired to a process control room and do not use wireless communication techniques.

Industrial process plants often contain hundreds or even thousands of field devices. Many of these field devices contain sophisticated electronics and are able to provide more data than the traditional analog 4-20 mA measurements. For a number of reasons, cost among them, many plants do not take advantage of the extra data that may be provided by such field devices. This has created a need for a wireless adapter for such field devices that can attach to the field devices and transmit data back to a control system or other monitoring or diagnostic system or application via a wireless network.

In order to operate an industrial process plant, field devices must often carry hazardous location approval ratings. There are different types of ratings and, to be widely adopted, a wireless field device adapter should be able to attach to each such field device without compromising the hazardous location approval rating of that field device.

One of these approval ratings is known as an explosion-proof or explosion-protected rating. The purpose of an explosion-proof enclosure is to contain an explosion should flammable gas enter the enclosure and ignite. If the enclosure fails to contain the explosion, it could ignite surrounding gases with catastrophic results.

Another type of approval rating is known as intrinsic safety (IS). An intrinsically safe device prevents ignition of flammable gases by limiting the amount of energy present in the electronics and by ensuring that electronic components are spaced far enough apart to prevent arcing in the event of an electrical fault. The heat generated by electronic components is also controlled. Making the electronics of a device intrinsically-safe tends to drive up the number of components as well as increase circuit board size. This also poses a challenge when the form factor of a device must be minimized.

In order for a wireless communication adapter to be used in explosion-proof installations, it must be explosion-protected itself and it must provide an explosion-proof barrier at the connection between the two devices. For an intrinsically-safe installation, the wireless communication circuitry must be intrinsically-safe as well. The ability to attach such an adapter to any device also drives the form factor. Industrial devices, such as field devices, can be installed in many configurations and are often disposed in tight spaces. This necessitates a small and unobtrusive design.

Providing a wireless communication adapter for field devices that is relatively small and unobtrusive yet still able to facilitate compliance with explosion-proof certifications and intrinsic safety would advance the art of wireless process communication.

SUMMARY

A wireless process communication adapter for field devices is provided. The adapter includes a metal housing having a first end and a second end. A chamber is defined between the first and second ends. A radio-frequency transparent radome is coupled to the first end. The second end has a field device coupling configured to attach to a field device. At least one circuit board is disposed within the chamber. The circuit board supports at least wireless process communication circuitry. A plurality of wires is coupled to the at least one circuit board and extends through the field device coupling. A silicone potting fills substantially all volume within the chamber not occupied by the at least one circuit board and wireless process communication circuitry.

DETAILED DESCRIPTION OF ILLUSTRATIVE EMBODIMENTS

Embodiments of the present invention generally provide a wireless transmitter that may be attached to a process wired field device that is either explosion-proof or intrinsically safe without compromising approval ratings of such field device. The wireless communication adapter is configured to provide explosion protection and also preferably contains intrinsically safe electronics. The adapter preferably includes an explosion-proof bather at the connection point to the process-wired device and includes electronics that are fully encapsulated.

Figure 1:
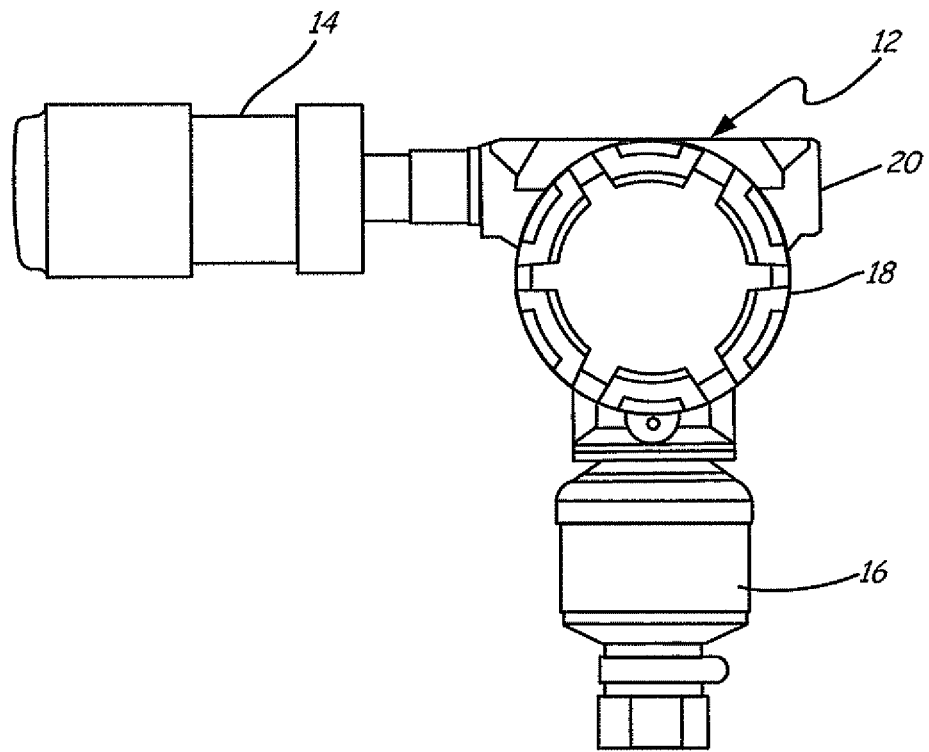
FIG. 1 is a diagrammatic view of a process-wired field device operably coupled to the wireless communication adapter in accordance with an embodiment of the present invention.

FIG. 1 is a diagrammatic view of a process-wired field device 12 operably coupled to a wireless communication adapter 14, in accordance with an embodiment of the present invention. While field device 12 is illustrated in FIG. 1 as a process fluid pressure transmitter, such as that sold under the trade designation Model 3051S, available from Emerson Process Management of Chanhassen, Minn., any suitable field device may be used. Typically, a field device includes a sensor module, such as sensor module 16, and an electronics module, such as electronics module 18. Field device 12 is often designed for compliance with explosion-proof regulations. Further, the design of electronics within field device 12 can be in accordance with an intrinsic safety requirement, such as one or more of the portions of the standard promulgated by Factory Mutual Research in October 1998 entitled APPROVAL STANDARD INTRINSICALLY SAFE APPARATUS AND ASSOCIATED APPARATUS FOR USE IN CLASS I, II, AND III, DIVISION 1 HAZARDOUS (CLASSIFIED) LOCATIONS, CLASS NUMBER 3610. Field device 12 typically includes a sensor, such as a pressure sensor, in sensor module 16 which transduces a process fluid characteristic, such as pressure, and provides an electrical indication of that process fluid variable to electronics module 18. Electronics module 18 then communicates process variable information over a process communication loop which typically couples via input 20.

As described above, it is becoming advantageous to provide additional communication abilities, such as a wireless communication ability, to process wired field devices. By providing a wireless process communication adapter, such as process communication adapter 14, additional digital information can be conveyed beyond that transmitted through the process wired connection. Such information may be communicated to a separate monitoring or diagnostic system or application for analysis. Further, the simple provision of an additional communication resource, such as adapter 14, also allows for redundant communication. It is important for process communication adapter 14 to be coupleable to field devices without adversely affecting the assembly's ability to continue to meet explosion-proof and/or intrinsic safety requirements.

Figure 2:
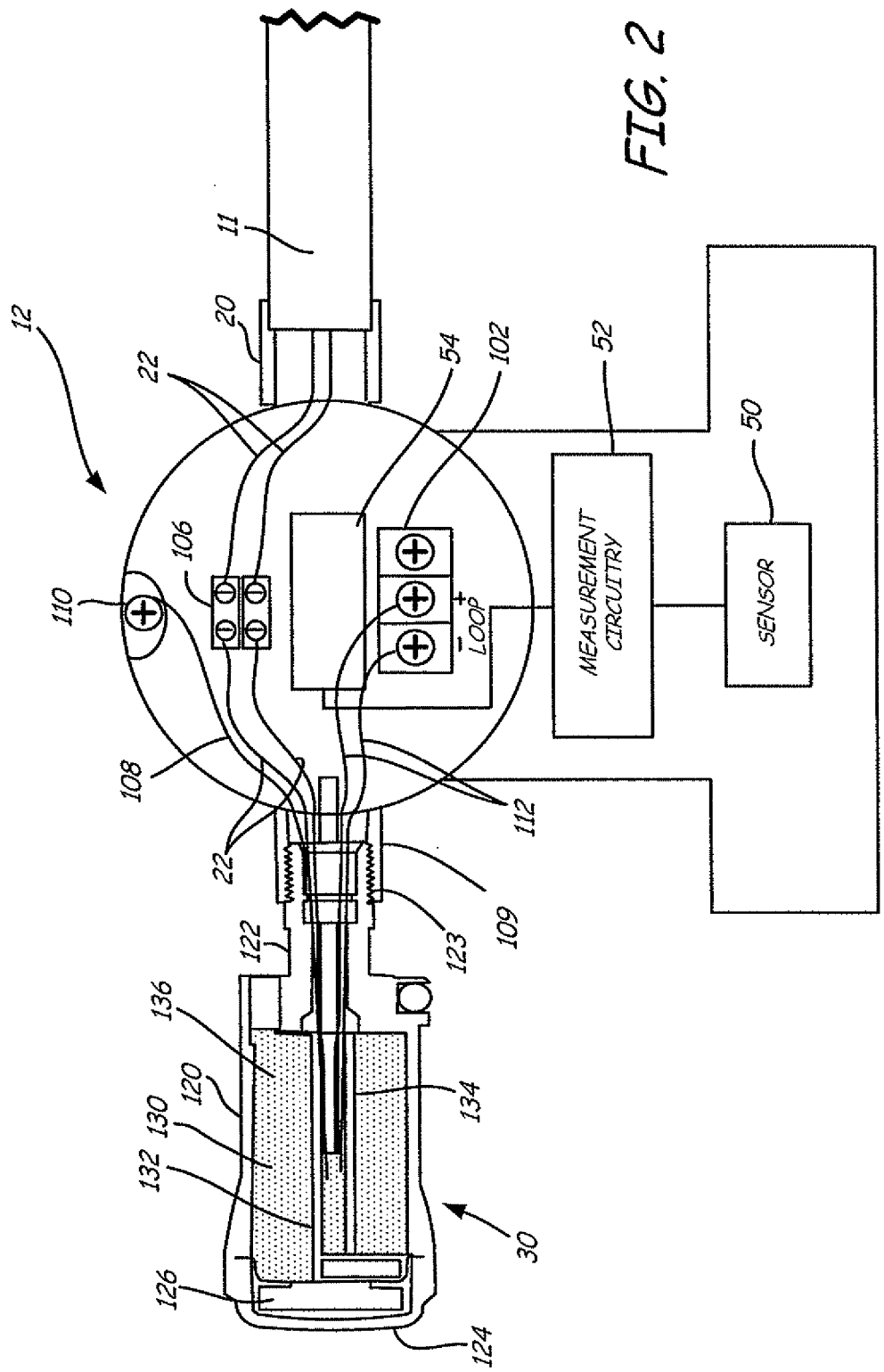
FIG. 2 shows a simplified cross-sectional view of a field device and wireless process communication adapter in accordance with an embodiment of the present invention.

FIG. 2 shows a simplified cross-sectional view of field device 12 and wireless process communication adapter 30 in accordance with an embodiment of the present invention. Field device 12 is coupled to process communication loop 22 through input 20 and conduit 11. Examples of process communication loops include the Highway Addressable Remote Transducer (HART®) protocol and the FOUNDATION™ Fieldbus protocol. However, other wired process communication protocols are known. In the example of a process variable transmitter, field device 12 includes a process variable sensor 50 which is connected to measurement circuitry 52 to measure a process variable. Transmitter circuitry 54 is configured to receive the process variable and communicate the process variable onto the two-wire process control loop 22 using known techniques. Field device 12 couples to two-wire process control loop 22 through connection block 102. Wireless communication adapter 30 couples to two-wire process control loop 22 through connection block 106 and is mounted to the housing of field device 12, for example, through threaded connections 123 and 109. The chassis of the wireless process communication adapter 30 couples to an electrical ground connector 110 of field device 12 through wire 108. Field device 12 includes two-wire process connection block 102 which couples to connection 112 from wireless process communication adapter 30. Housing 120 of wireless process communication adapter 30 carries an antenna 126 which couples to wireless communication circuitry of the wireless process communication adapter 30. A radio-frequency (RF) transparent end cap 124 can be used to sealably couple to housing 120 to allow transmission of RF signals therethrough. In the arrangement shown in FIG. 2, five electrical connections are provided to the radio-frequency adapter, which include four loop connections along with an electrical ground connection.

Figure 3:
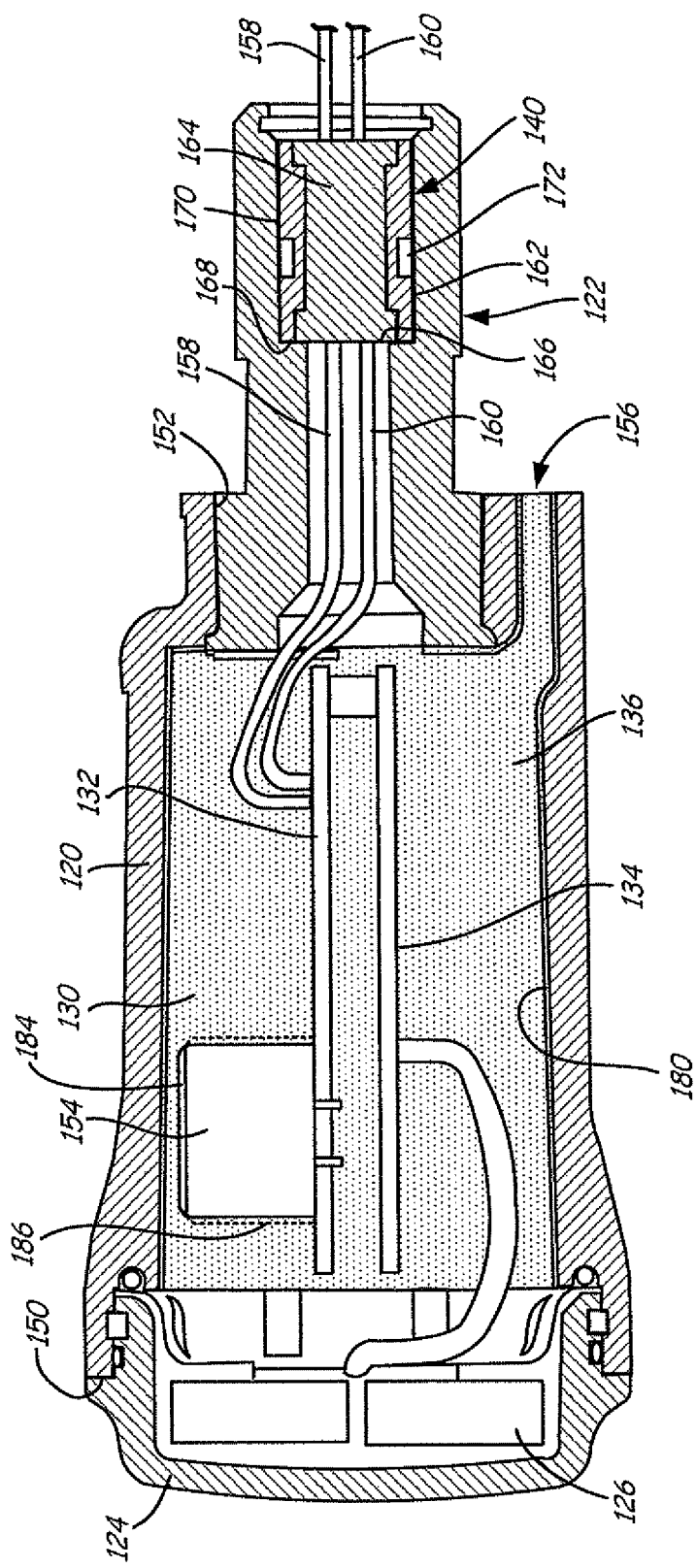
FIG. 3 is a cross-sectional diagrammatic view of a wireless process communication adapter in accordance with an embodiment of the present invention.

FIG. 3 is a cross-sectional diagrammatic view of a wireless process communication adapter in accordance with an embodiment of the present invention. As illustrated in FIG. 3, wireless process communication adapter 30 preferably includes a cylindrical, metal enclosure 120 with a large opening 150 at one end to accommodate radio-frequency transparent radome or end cap 124, and a relatively small opening 152 at the other end to accommodate field device coupling 122. Electronics 154 reside within cavity 130 preferably on a pair of printed circuit boards 132, 134. The electronics preferably include wireless communication circuitry to allow wireless process communication adapter to communicate in accordance with one or more wireless communication protocols. Examples of suitable wireless process communication protocols include: wireless networking technologies (such as IEEE 802.11b wireless access points and wireless networking devices built by Linksys of Irvine, Calif.); cellular or digital networking technologies (such as Microburst® by Aeris Communications Inc. of San Jose, Calif.); ultra wide band, free space optics, Global System for Mobile Communications (GSM), General Packet Radio Service (GPRS); Code Division Multiple Access (CDMA); spread spectrum technology, infrared communications techniques; SMS (Short Messaging Service/text messaging); a known Bluetooth Specification, such as Bluetooth Core Specification Version 1.1 (Feb. 22, 2001), available from the Bluetooth SIG (www.bluetooth.com); and the WirelessHART Specification published by the Hart Communication Foundation, for example. Relevant portions of the Wireless HART® Specification include: HCF_Spec 13, revision 7.0; HART Specification 65—Wireless Physical Layer Specification; HART Specification 75—TDMA Data Link Layer Specification (TDMA refers to Time Division Multiple Access); HART Specification 85—Network Management Specification; HART Specification 155—Wireless Command Specification; and HART Specification 290—Wireless Devices Specification.

The electronics on each circuit board 132, 134 are preferably mounted with spacing around them, and between the circuit boards, to facilitate flow of a potting compound. With the enclosure sealed, a potting 136 is injected into chamber 130 through passageway 156 until the enclosure is full. While any suitable potting compound can be used, it is important for the potting material itself to meet the requirements of the approval agencies, which include suitable chemical resistance, thermal endurance at hot and cold operating temperatures, as well as other relevant parameters. Some embodiments of the present invention provide specific encapsulation-using silicone and specific adaptations in order to accommodate the various thermal stresses generated within the adapter across the entire thermal operating range of the adapter. Radome 124, enclosure 120, and field device coupling 122 provide a weather-tight shell for potting 136.

Field device coupling 122 provides a method of attaching directly to field device 12. Feedthrough assembly 140 preferably also serves as an explosion-proof barrier at the connection point. If flammable gases enter the enclosure of the field device and ignite, feedthrough assembly 140 will contain the explosion. Wire leads 158, 160 pass through feedthrough assembly 140. The interior of the coupling is filled with a potting capable of withstanding explosive pressure. The interior of the coupling includes a shoulder 166 that helps retain the potting in the coupling. Field device coupling 122 can also include a union and/or elbow to provide adjustability, as desired. In one embodiment, the explosion-proof barrier is provided by running wires 158, 160 through a cemented joint 164 in feedthrough assembly 140. This cemented joint 164 is created by filling feedthrough assembly 140 with a potting capable of withstanding explosive pressure.

Wireless process communication adapter 30 thus preferably uses encapsulation and adaptation of a feedthrough assembly to provide explosion and environmental protection and to reduce the spacing required between electronic components for intrinsic safety protection. Intrinsic safety spacing requirements are less stringent when the space between the components is filled with potting. This allows the entire device to be miniaturized more effectively. Encapsulation achieves explosion protection by excluding flammable gases entirely. The electronics of wireless process communication adapter 30 are completely surrounded by potting and therefore protected from the environment.

Some embodiments of the present invention arise from an appreciation of the difficulties of filling the metal housing 120 with a potting material such as a plastic or epoxy. It was extremely difficult, if not impossible, to design enough free space to allow the extra expansion/contraction of the potting over the operating temperature of the adapter without increasing the size of the final product. However, increasing the size of the final product was deemed very undesirable from a marketplace acceptance perspective. Instead, silicone potting is used, in some embodiments of the present invention, to encapsulate the electronics and it was determined that the silicone potting would adhere to the aluminum housing 120 but not circuit boards 132, 134 when the ambient temperature was below the cure temperature of the potting. Applying a silicone primer to the circuit board occasionally caused the potting to pull components off of the circuit boards, thereby potentially lowering manufacturing yields. Moreover, it was also determined that the potting could apply enough pressure to destroy large electronic components, such as electrolytic capacitors, by crushing those components when the ambient temperature was above the cure temperature of the potting.

Embodiments of the present invention generally provide a fully encapsulated wireless process communication adapter that employs a combination of a mold release, foam, and specifically cured silicone potting to compensate for relatively large thermal expansion differences between the potting and the rest of the components within the adapter.

There are four components that interrelate to provide an exceptional potting solution for a wireless process communication adapter. Those components include the type of the silicone potting, the type of the mold release, the provision of a foam cushion, and the cure process.

The silicone potting material was determined to be an exceptional candidate for the potting design. In particular, two-part silicone materials were chosen for the high density surface mount assemblies provided on circuit boards 132, 134 because these materials are compliant, and elastomeric materials generally do not apply high stresses to assemblies. Further, silicone potting materials provide good electrical properties and a wide useful temperature range. The choice of the silicone potting material helped drive the choice of the mold release, foam, and cure processes as follows.

In order to meet the intrinsic safety approval specifications set forth above, as well as long term reliability requirements, the silicone potting material needs to adhere to circuit boards 132, 134 in the product, but not housing 120. A number of factors make such design criteria difficult. Specifically, silicone adheres better to aluminum housing 120 than circuit boards 132, 134. Moreover, the large coefficient of thermal expansion of the silicone potting material made it pull away from circuit boards 132, 134 at relatively low ambient temperatures, thereby creating a gap between the potting material and the circuit boards. Further still, a silicone primer could increase the adhesion to the circuit boards so much that it resulted in occasional failures in the solder joints that hold the electrical components to circuit boards 132, 134. In order to create a situation where the silicone potting would adhere to the circuit boards during repeated thermal cycling, a mold release was sprayed on the inside of housing 120. The mold release generally lowered the adhesion of the silicone potting material to aluminum housing 120 below the adhesion of the silicone potting material to circuit boards 132, 134, thereby resulting in adhesion of the silicone potting material to circuit boards 132, 134 even at low temperatures. At such low temperatures, a gap was created between the silicone potting material and aluminum housing 120. Generally, silicone potting materials do not adhere well to many things, making it difficult to find a mold release that will lower the adhesion even further. As an example, Teflon® available from DuPont is a common mold release for silicones and works well in preventing the silicone from adhering to aluminum. Unfortunately, the silicone potting adhered better to Teflon® than to circuit boards 132, 134. Similarly, silicone oil is another common mold release but, because of the similarity to the silicone potting, the silicone mold release actually increased the adhesion to aluminum housing 120. Instead, a mold released based on lecithin was employed to lower the adhesion of the silicon to aluminum housing 120 below the adhesion of the silicone to circuit boards 132, 134. This layer of lecithin mold release is illustrated in FIG. 3 diagrammatically at reference numeral 180.

Figure 4:
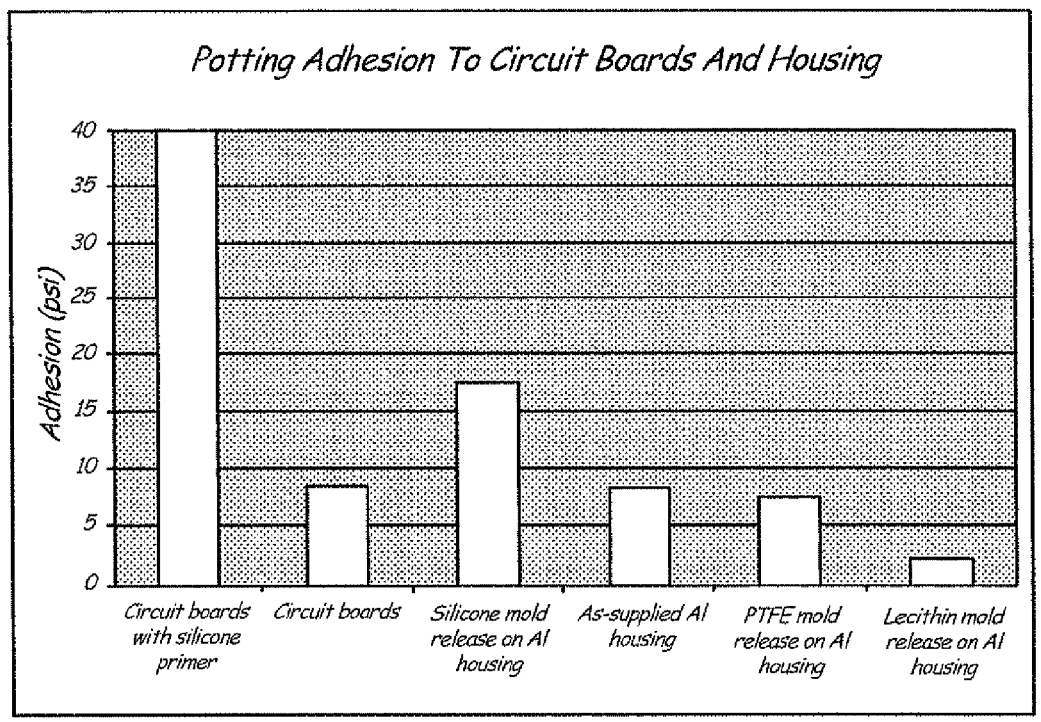
FIG. 4 is a chart of adhesion testing results for silicone potting to various surfaces.

FIG. 4 is a chart illustrating the results of adhesion testing for silicone potting to various surfaces. This testing was useful in arriving at the synergistic selection of materials and processes for embodiments of the present invention. The adhesion of silicone potting to the circuit boards varied with the cure temperature of the potting. Higher potting cure temperatures were found to result in lower adhesion of the potting to the circuit boards, while lower potting cure temperatures resulted in higher adhesion of the silicone potting to the circuit boards. The adhesion of the silicone potting to the aluminum housing appear to be unaffected by the cure temperature of the potting.

Since low silicone potting cure temperatures are desirable to maximize adhesion to the circuit boards, the high thermal expansion of the potting over the operating temperature of the process adapter could result in high internal pressure within housing 120 between the potting cure temperature and the upper operating temperature limit of the adapter. For some embodiments, a 22° Celsius potting cure temperature was originally used. For reference, the upper operating temperature of the wireless process communication adapter is approximately 85° Celsius. The difference in thermal expansion between the silicone potting material cured at 22° Celsius and the upper operating temperature resulted in an approximate 9000 psi pressure rise within housing 120. This pressure was large enough to crush electronic components, such as electrolytic capacitors, within the wireless process adapter. While it was also determined that the pressure could be lowered by simply raising the potting cure temperature, this had a negative impact on the adhesion of the silicon potting material to the circuit boards.

As shown in FIG. 4, using a silicone primer, an adhesion rating of approximately 40 psi between the silicone potting and the circuit boards was observed. Without any primer whatsoever, the adhesion was approximately 7.5 psi between the circuit boards and the silicone potting. The adhesion between the silicone potting material and the aluminum housing, when sprayed with a mold release, was determined to be approximately 17.5 psi. Without the use of a mold release, the adhesion between the aluminum housing and the silicone potting material was approximately 8 psi. Moreover, the adhesion between the silicone molding material and the aluminum housing, when sprayed with a PTFE mold release, was approximately 7.5 psi. Finally, the adhesion between the aluminum housing and the silicone mold release, when sprayed with a lecithin mold release, was approximately 2.5 psi. Certainly, spraying or otherwise providing the circuit boards with a silicone primer will ensure that the adhesion between the silicone potting material and the boards is much higher than the adhesion between the aluminum and the silicone potting material. However, as illustrated in FIG. 4, the silicone primer increases the adhesion to circuit boards too much, which resulted in occasional failures of the solder joints that hold the electrical components to the circuit boards. However, when lecithin mold release is used on the aluminum housing, the adhesion with the silicone potting is less than that of the unprimed circuit boards.

In order to balance the need for a low-temperature cure for the silicone to improve adhesion to the circuit boards while still preventing crushing of larger electronics components, such as electrolytic capacitors, a layer of polyethylene foam was added to protect such components at ambient temperatures higher than the cure temperature of the potting. FIG. 3 illustrates, diagrammatically, electrolytic capacitor 154 supported upon circuit board 132. Disposed between electrolytic capacitor 154 and silicone potting material 130 is a polyethylene foam cushion 184. While other materials can be used in accordance with embodiments of the present invention, polyethylene was chosen based on its compressibility and compatibility with two-part silicone potting materials. Foam that was harder to compress would have had to be thicker to absorb the pressure and foam that was not compatible with silicone potting material would result in cure inhibition in the silicone (cure inhibition results in a silicone that remains liquid rather than solidifying). Additionally, the lateral side walls of the component can also be protected by a foam cushion, as illustrated diagrammatically at reference numeral 186. The optional side wall foam can be in the form of a sleeve, or other suitable shape, that is sized to conform to the outer periphery of the electronic component.

Figure 5:
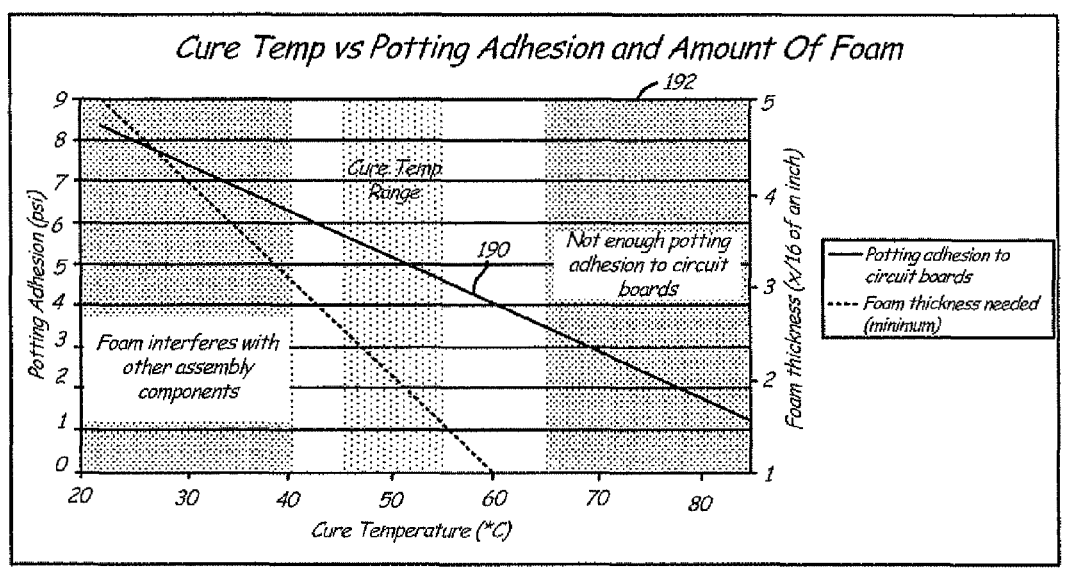
FIG. 5 is a chart of silicone potting cure temperature versus potting adhesion and the amount of foam required.

FIG. 5 is a chart of silicone potting cure temperature versus potting adhesion and the amount of foam required for various experiments which gave rise to embodiments of the present invention. As illustrated in FIG. 5, the potting adhesion strength varies from that cured at approximately 22.5° Celsius having an adhesion of about 8.4 psi to a potting adhesion strength of approximately 1.2 psi for silicon potting material cured at approximately 85° Celsius. This is illustrated at line 190 in FIG. 5. Additionally, the region 192 illustrates results where the potting adhesion to the circuit boards was not high enough for acceptable results. Additionally, a minimum foam thickness needed to protect electronic components from the thermal compressive forces within the wireless process adapter vary from approximately five-sixteenths of an inch for a cure temperature of approximately 22° Celsius to a foam insulation of one-sixteenth of an inch required for silicone potting material cured at 60° Celsius. As a result of this experimentation, a silicone cure temperature of 50° Celsius was selected and a polyethylene foam pad thickness of one-eighth of an inch was selected to protect the larger electronic components within the wireless process communication adapter. As illustrated in FIG. 5, however, other combinations of foam pad thickness and silicone potting material cure temperature can be practiced in accordance with embodiments of the present invention. More specifically, FIG. 5 illustrates acceptable results by potting temperature of approximately 45° Celsius with a foam thickness on the order of seven-thirty-seconds of an inch to acceptable results being provided at a silicone potting material of approximately 55° Celsius with a polyethylene foam pad thickness of one-sixteenth of an inch.

Although the present invention has been described with reference to preferred embodiments, workers skilled in the art will recognize that changes may be made in form and detail without departing from the spirit and scope of the invention.

What is claimed is:

1. A wireless process communication adapter for field devices, the adapter comprising:
   a metal housing having a first end and a second end and defining a chamber therebetween, the first end having an RF transparent radome coupled thereto, the second end having a field device coupling configured to attach to a field device;
   at least one circuit board disposed within the chamber, the circuit board supporting at least wireless process communication circuitry;
   a plurality of wires coupled to the at least one circuit board and extending through the field device coupling;

a potting filling substantially all volume within the chamber not occupied by the at least one circuit board and wireless process communication circuitry;

a compressible layer separating at least one electrical component of the at least one circuit board from the potting, the compressible layer operable to prevent the potting from crushing the component due to thermal expansion of the potting; and a release layer adhered to the metal housing, the release layer configured to promote adhesion of the potting to the at least one circuit board during repeated thermal cycling and creating a gap between the potting material and the metal housing at low temperatures;

wherein the potting comprises silicone potting which has a greater adhesion to the at least one circuit board than to the release layer;

whereby, during thermal contraction of the potting, the potting separates from the release layer while adhering to the at least one circuit board.

2. The adapter of claim 1, wherein the potting is a two-part silicone potting.

3. The adapter of claim 1, wherein the release layer is a lecithin.

4. The adapter of claim 3, the compressible layer comprising foam disposed between the at least one electrical component on the at least one circuit board and the potting.

5. The adapter of claim 4, wherein the foam pad is constructed from polyethylene.

6. The adapter of claim 5, and further comprising a foam jacket surrounding the at least one electrical component.

7. The adapter of claim 1, and further comprising a foam pad disposed between at least one electrical component on the at least one circuit board and the metal housing.

8. The adapter of claim 7, wherein the foam pad is constructed from polyethylene.

9. The adapter of claim 8, and further comprising a foam jacket surrounding the at least one electrical component.

10. The adapter of claim 8, wherein the potting is cured at about 50 degrees Celsius.

11. The adapter of claim 1, wherein the potting is cured at about 50 degrees Celsius.

12. The adapter of claim 1, wherein the potting is silicone potting.

13. The adapter of claim 1, wherein the potting has a large coefficient of thermal expansion relative to that of the at least one circuit board.

14. The adapter of claim 4, wherein the foam comprises a foam pad that is compressed in response to thermal expansion of the potting.

* * * * *